(12) United States Patent
Zipper et al.

(10) Patent No.: US 6,208,211 B1
(45) Date of Patent: Mar. 27, 2001

(54) LOW JITTER PHASE LOCKED LOOP HAVING A SIGMA DELTA MODULATOR AND A METHOD THEREOF

(75) Inventors: Eliav Zipper, Ramat Gan; Michael Zarubinsky, Jerusalem; David Moshe, Taanach; Yachin Afek, Cfar Saba, all of (IL)

(73) Assignee: Motorola Inc., Schaumburg, IL (US)

( * ) Notice: Subject to any disclaimer, the term of this patent is extended or adjusted under 35 U.S.C. 154(b) by 0 days.

(21) Appl. No.: 09/406,014

(22) Filed: Sep. 24, 1999

(51) Int. Cl.[7] .............................. H03B 5/02; H03L 7/093
(52) U.S. Cl. ................. 331/17; 331/25; 331/57
(58) Field of Search .................. 331/17, 25, 57

(56) References Cited

U.S. PATENT DOCUMENTS

| 4,380,742 | 4/1983 | Hart ........................... 331/1 A |
| 5,079,521 | 1/1992 | Gaskell et al. ............... 331/1 A |
| 5,105,160 | 4/1992 | Summers ..................... 328/133 |
| 5,111,155 | 5/1992 | Ii .................................. 328/155 |
| 5,168,245 | 12/1992 | Koskowich .................. 331/1 A |
| 5,173,617 | 12/1992 | Alsup et al. ................. 307/269 |
| 5,268,653 | 12/1993 | Lafon .......................... 331/1 A |
| 5,347,234 | 9/1994 | Gersbach et al. ............ 331/57 |
| 5,349,311 | 9/1994 | Mentzer ....................... 311/57 |
| 5,382,922 | 1/1995 | Gersbach et al. ............ 331/1 A |
| 5,574,455 | 11/1996 | Hori et al. .................... 341/144 |
| 5,617,454 | * 4/1997 | Gotz et al. ................... 331/18 |
| 5,625,358 | 4/1997 | Wilson et al. ................ 341/143 |
| 5,654,675 | 8/1997 | Bruccoleri et al. ........... 331/17 |
| 5,668,503 | 9/1997 | Gersbach et al. ............ 331/1 A |
| 5,727,038 | 3/1998 | May et al. .................... 375/376 |
| 5,745,533 | 4/1998 | Asada et al. .................. 375/354 |
| 5,748,043 | 5/1998 | Koslov .......................... 331/1 A |
| 5,844,447 | 12/1998 | Choi .............................. 331/57 |
| 5,844,954 | 12/1998 | Casasanta et al. ........... 375/373 |
| 5,856,762 | 1/1999 | Werker et al. ................ 331/11 |
| 5,892,406 | 4/1999 | Dicke et al. .................. 331/40 |

* cited by examiner

Primary Examiner—Siegfried H. Grimm

(57) ABSTRACT

A phase locked loop PLL has a current controlled oscillator ICO, having an input resistance Rin. Rin is proportional to a control current Idac sent to ICO. ICO is coupled to a capacitor, the capacitor and Rin introduce a pole Fpole in the transfer function of PLL. The PLL further has a sigma delta modulator, for providing a digital sigma delta modulated control signal SDO, SDO is converted to an analog control current Idac, that is provided to ICO and smoothed by Rin and the capacitor. The sigma delta modulator forces error signal outside a predetermined frequency BWsd; and Fpole tracks BWsd.

6 Claims, 3 Drawing Sheets

LOW JITTER PHASE LOCKED LOOP HAVING A SIGMA DELTA MODULATOR AND A METHOD THEREOF

FIELD OF THE INVENTION

The invention relates to a low jitter phase locked loop having a sigma delta modulator and a method thereof, and especially to a semi analog phase locked loop having a current controlled oscillator, the current controlled oscillator is coupled to a capacitor, for introducing a pole in the transfer function of the phase locked loop.

BACKGROUND OF THE INVENTION

Phase lock loop (i.e.—PLL) is used in a variety of integrated circuits. Prior art PLLs are comprised of a phase detector, a loop filter, a voltage controlled oscillator (i.e.—VCO) and a frequency divider (See: Phase Locked Loops, Design Simulations and Applications, Roland E. Best, 1997 Mc-Graw Hill, ISBN 0-07-006051-7, PG. 91–177). The PLL receives a reference signal REF having a frequency of Fref, from an external signal source and outputs a signal VCOS having a frequency of Fvco. The frequency divider receives an VCOS and outputs a signal FD having a frequency of (Fvco/N). Usually, N is proportional to Fvco. Prior art PLL have a transfer function Hpa(s) which have a bandwidth BWpa.

A premium is placed upon the rejection of high frequency noise and error signals. These high frequency signals can increase the frequency jitter of the PLL. A better rejection can be achieved by introducing a third pole Fpole3 to transfer function Hpa(s), wherein Fpole>=BWpa.

U.S. Pat. No. 5,654,675 of Bruccoleri et al discloses a phase lock loop with a transfer function that has a third pole. This PLL includes a phase detector, a charge pump, a low pass filter and a VCO. The VCO is coupled to a Resistor Capacitor (i.e.—RC) network, for providing the third pole in the transfer gain of the PLL. The R-C network includes a variable capacitor C1, three resistors R1, R2 and R3 three transistors T1, T2, T3 and a current source I. The capacitance of C1 is controlled by a digital to analog converter (i.e.—DAC). A disadvantage of this solution is that the RC network elements produce noise, this noise is received by the VCO, and increases the frequency jitter. Another disadvantage of this solution is the production of quantization errors by the DAC, which increase the frequency jitter of the VCO.

In many PLLs the phase detector provides a digital signal, that is converted to an analog signal, wherein the analog signal is eventually used to control Fvco. Some PLLs use sigma-delta modulators in order to improve the digital to analog conversion (See: U.S. Pat. No. 5,625,358 of Wilson et al).

Sigma delta conversion use over-sampling and noise shaping techniques to force error signal resulting from the conversion outside a predetermined frequency BWsd. Usually, BWsd is dependent upon the over-sampling ratio OSR, the OSR being the ratio of the sampling frequency Fsam to the Nyquist frequency 2*Fref. Larger OSR result in larger BWsd. Ususlly, BWsd>Bwpa so that these high frequency signals are rejected by the PLL.

A sigma delta is usually followed by a low pass filter, for rejecting the error signals. The rejection of the error signals is very significant in PLL that have a sigma delta modulator. Without a low pass filter these error signals can increase the frequency and phase jitter of the PLL.

The over sampling ratio OSR, and accordingly BWsd change when the frequency Ferf changes. There is a need to have a low pass filter, that introduces a pole Fpole in the transfer function of the PLL, wherein Fpole tracks BWsd.

In many prior art PLL, the VCO receives an input signal that has a limited number of possible values. The VCO provides a required frequency Fref by switching between two discrete frequencies, such that the average value yields the required frequency. This method involved providing the VCO with two discrete control signals. A disadvantage of such a method is that the switching can produce noise and increase the frequency jitter of the VCO. There is a need to have a low pass filter for averaging the discrete input signals provided to the VCO.

BRIEF DESCRIPTION OF THE DRAWINGS

While the invention is pointed out with particularity in the appended claims, other features of the invention are disclosed by the following detailed description taken in conjunction with the accompanying drawings, in which:

DETAILED DESCRIPTION OF THE DRAWINGS

It should be noted that the particular terms and expressions employed and the particular structural and operational details disclosed in the detailed description and accompanying drawings are for illustrative purposes only and are not intended to in any way limit the scope of the invention as described in the appended claims.

An aspect of the invention is a PLL having sigma delta modulator and a current controlled oscillator ICO, wherein a capacitor is coupled in parallel to the input of the ICO, producing a pole in transfer function of the PLL, the pole tracks the sigma delta characteristics. Thus, the pole increases the rejection of high frequency error signal resulting from the digital to analog conversion. The pole is also used to smooth the current being inputted to the ICO and reduce the frequency jitter of ICO.

Another aspect of the invention is providing a capacitor coupled to the ICO that smoothes the input current signal provided to the ICO and also rejects high frequency power supply noises.

Figure 1:
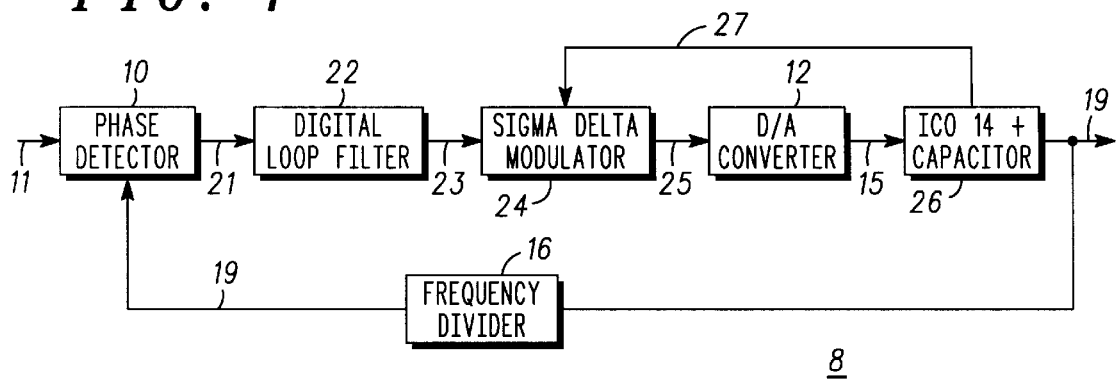
FIG. 1 is a schematic description of a phase locked loop, according to a preferred embodiment of the invention.

FIG. 1 is a schematic description of PLL 8 according to a preferred embodiment of the invention. PLL 8 is comprised of phase detector 10, a digital loop filter 22, a sigma delta modulator 24, a digital to analog converter 12, a frequency divider 16 and a current controlled oscillator ICO 14 coupled to a capacitor 26. PLL 8 can also comprise of a voltage controlled oscillator (VCO) or a digital controlled oscillator (DCO), but for convenience of explanation it is assumed that ICO is current controlled. ICO 14 converts the current control signal to a frequency output signal ICOS having a frequency of Fico, whereas Fico is proportional to the value of the current control signal.

Phase detector 10 is coupled to digital loop filter 22, via bus 21. Digital loop filter is coupled to sigma delta modulator 24 via bus 23. Sigma delta modulator 24 is coupled to digital to analog converter DAC 12 via bus 25 and to ICO 14 via bus 27. DAC 12 is coupled to ICO 14 and capacitor 24 via bus 15. ICO 14 and capacitor 26 are coupled to frequency divider 16 via bus 17. Phase detector 10 is coupled to frequency divider 16 via bus 19 and to a reference clock generator (not shown in FIG. 1) via bus 11. Phase detector 10 receives a reference signal REF from reference clock generator having a frequency of Fref and an output signal FD having a frequency of Ffd=(Fico/N) from frequency divider 16. Phase detector 10 outputs a digital error signal ERS reflecting the phase (frequency) difference between Fref and Fico/N. ERS is received by digital loop filter 22, filtered and provided to sigma delta modulator 24. Conveniently the signal that is provided to the sigma delta modulator is referred to as SDI. Preferably, bus 23 is much wider than bus 25.

Sigma delta modulators are known in the art. (See: Delta Sigma Data Converters" by Norsworthy, Schreier and Temes, IEEE Press 1997, ISBN 0-7803-1045-4). Sigma delta modulators are usually characterized by their order and the number of output levels (equivalent to the number of output bits). For convenience of explanation, it is assumed that sigma delta modulator 24 is of a second order and has a 5 bit output. When sigma delta modulator 24 receives an input signal SDI, the output signal of the sigma delta modulator SDO oscillates between two or more levels that are adjacent to the value of SDI, whereas the local average of SDO equals the average value of SDI. These oscillations are reflected in the analog output signal Idac provided by DAC 12 to ICO 14 and capacitor 26, and are smoothed by ICO 14 and capacitor 26.

ICO 14 converts the smoothed analog output signal Idac to a frequency output signal ICOS, whereas the frequency Fico is proportional to the value of the smoothed Idac.

ICOS is received, via bus 27, by sigma delta modulator 24, that samples SDI in a rate of Fico.

A frequency lock is achieved when (Fico/N) equals Fref, or when the difference between these two frequencies is negligible. A phase lock is usually achieved after a frequency lock is achieved. A phase lock is achieved when there is no phase difference or there is a negligible phase difference between FD and REF.

Figure 2:
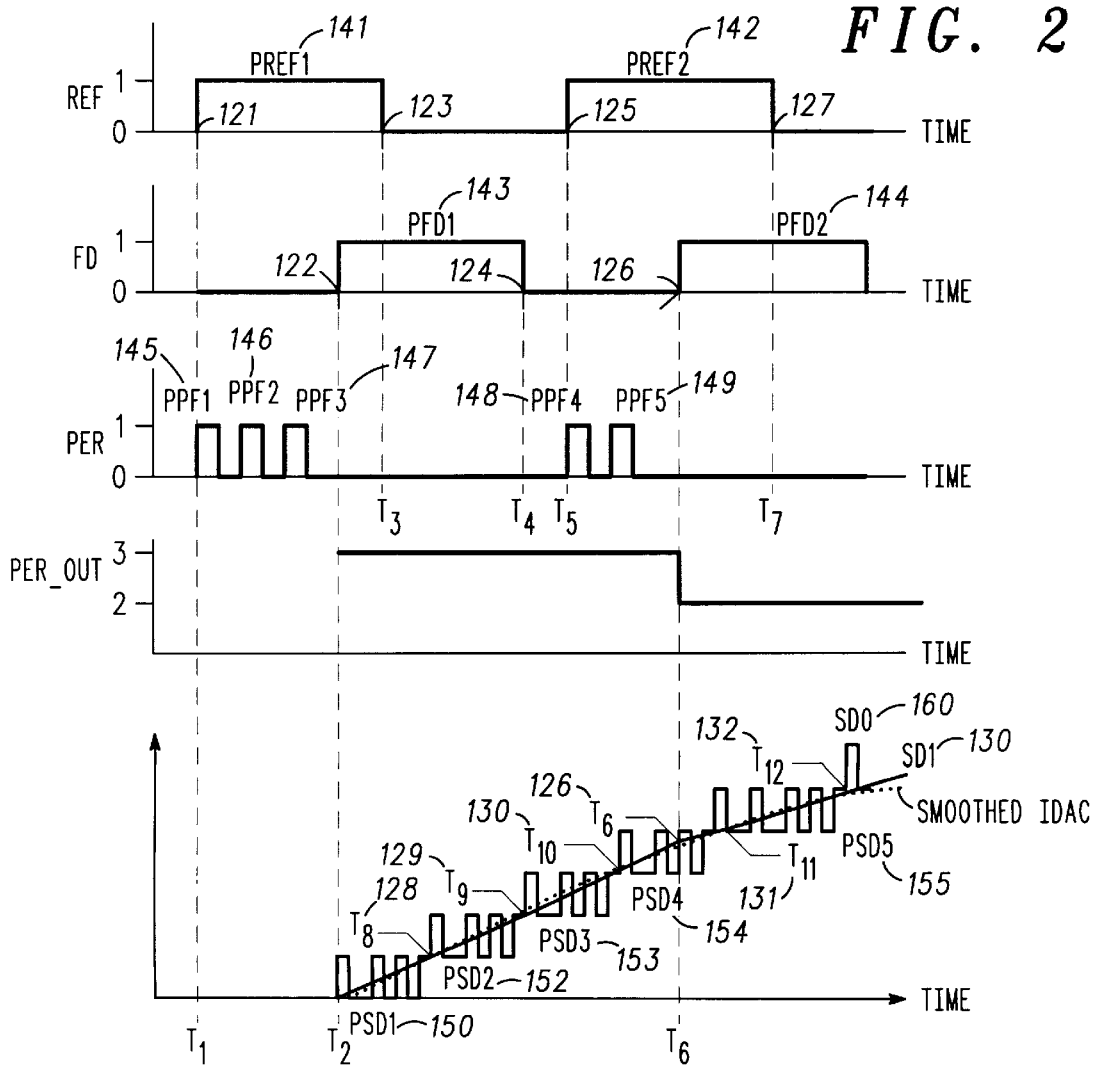
FIG. 2 shows the various signals generated within the phase locked loop, according to an embodiment of the invention.

FIG. 2 shows the various signals generated within the PLL, according to an embodiment of the invention. Phase detector 10 receives REF and FD. REF rises at T1 121 and T5 125 and drops at T3 123 and T7 127. FD rises at T2 122 and T6 126 and drops at T4 124 and T7 127. Phase detector 10 has a counter and a latch (both not shown in FIG. 105). The Counter receives REF, FD and a very fast clock signal FD_CLK having a frequency of Ffdclk, Ffdclk>>Fico. The counter counts the period that lapses between a rise of REF and a corresponding rise of FD and provides an output signal PER that reflects that period. Furthermore, PER is positive when a rise of FD precedents the rise of REF, and is negative when a rise of FEF precedents the rise of FD. For example, between T1 121 and T2 122 it outputs three pulses Ppf1–Ppf3 145–147, and between T5 125 and T6 126 it outputs two pulses Ppf4–Ppf5 148–149, wherein (T2–T1)*2≈(T6–T5)*3.

PER is provided to the latch unit, that outputs error signal ERS, the level of ERS reflects the value of PER. For example, after the counter provided three pulses Ppf1–Ppf3 145–147, ERS equals 3. After the counter outputs two pulses Ppf4–Ppf5 148–149, ERS equals 2. If FD rises before REF, PER Phase detector.

ER is provided to digital loop filter 22. For convenience of explanation it is assumed that digital loop filter 22 comprises of a digital integrator 220. Digital integrator 220 receives ER and provides an output signal SDI, wherein the slope of SDI equals the value of ER. DSI is denoted by a thick line 120. For example, ER="3" between T2 122 and T6 126. Thus the slope of SDI equals 3. The slope of SDI decreases to 2 at T6 126, when ER=2.

SDI is provided to sigma delta modulator 24, that accordingly provides SDO. SDO is denoted by a thin line 160. SDO oscillates between a first and a second value, a second and a third value, a third and fourth value, a fourth and fifth value, a fifth and sixth value, a sixth and seventh value (it produces a plurality of pulses referred to as Psd1 150. Psd2 152, Psd3 153, Psd4 154, Psd5 155 accordingly) between T2 122 and T8 128, between T8 128 and T9 129, between T9 129 and T10 130, between T10 130 and T11 131 and between T11 131 and T12 132 accordingly. The smoothed Idac is referred to a thick dashed line 170. Idac≈SDI.

Figure 3:
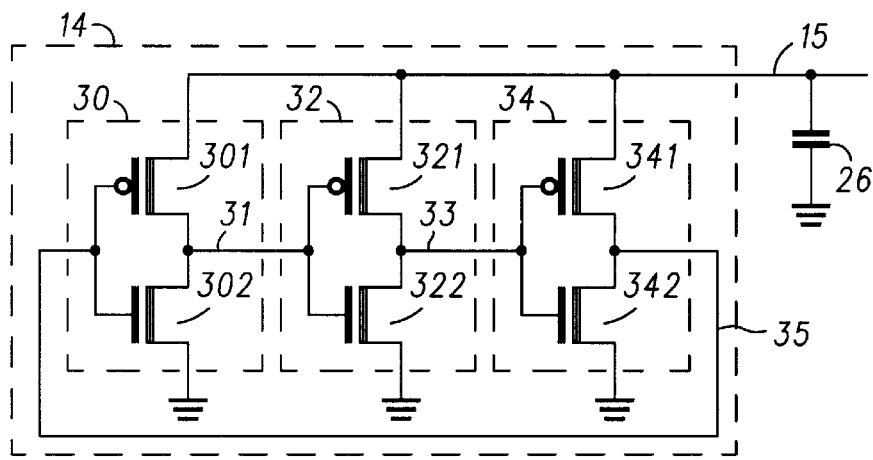
FIG. 3 is a detailed schematic view of a current controlled oscillator and a capacitor, according to a preferred embodiment of the invention.

FIG. 3 is a detailed schematic view of an ICO 14 and capacitor 26 according to a preferred embodiment of the invention. Current/Voltage/Digital controlled oscillators are well known in the art. The are usually comprised of an odd number of inverters that form a closed loop with positive feedback. (See: CMOS Circuit design, layout and simulations, Baker, Li Boyce, IEEE press 1998, ISBN 0-7803-3416-7, pages 201–230, 209–210, 383–390). A typical CMOS inverter is comprised of a p-channel transistor and an n-channel transistor. The gates of the two transistors are coupled to each other and to the input of the inverter. The source of the p-channel transistor and the drain of the n-channel transistor are coupled to each other and to the output of the inverter. The drain of the p-channel transistor is coupled to a voltage supply, and the source of the n-channel transistor is coupled to the ground.

The input DC resistance Rindc of an inverter is inversely proportional to Fico (to the level of Idac). The capacitance of capacitor 26 is constant; thus the pole F.pole depends upon Fref.Fpole≈1/(Rindc*C1).

The sigma delta modulator samples REF at a rate of Fico. The over sampling ratio OSR is Fico/2*Fref. Therefore, BWsd is also dependent upon Fref. Both BWsd and the pole Fpole are dependent upon Fref, thus the pole Fpole tracks BWsd.

Preferably, ICO 14 is comprised of three inverters 30, 32 and 34 that form a closed loop, the output of third inverter 34 is coupled to the input of first inverter 30 via bus 35. The output of first inverter 30 is coupled to the input of second inverter 32, via bus 31. The input of third inverter 34 is coupled to the output of second inverter 32, via bus 33. ICO oscillates in a frequency of Fico, wherein the frequency is determined by the delay of each of the inverters. The delay depends upon the level of Idac.

Each inverter is comprised of two transistors, an n-channel transistor and a p-channel transistor. Inverter 30, 32 and 34 are comprised of n-channel transistors 302, 322 and 342 accordingly and p-channel transistors 301, 321 and 341 accordingly.

The gates of transistors 301 and 302 are coupled to each other and to bus 35. The source of transistor 301 and the drain of transistor 302 are coupled to each other and to bus 31. The drain of transistor 301 is coupled to bus 15, and the source of transistor 302 is coupled to the ground. The gates of transistors 321 and 322 are coupled to each other and to bus 31. The source of transistor 321 and the drain of transistor 322 are coupled to each other and to bus 33. The drain of transistor 321 is coupled to bus 15, and the source of transistor 322 is coupled to the ground. The gates of transistors 341 and 342 are coupled to each other and to bus 33. The source of transistor 341 and the drain of transistor 342 are coupled to each other and to bus 35. The drain of transistor 341 is coupled to bus 15, and the source of transistor 342 is coupled to the ground.

Capacitor 26 is coupled to bus 15, in parallel to the drains of transistors 301, 321 and 341. Capacitor 26 and the three inverters form a low pass filter that smoothes Idac. The delay of each inverter, and accordingly Fico depend upon the level of Idac.

Figure 4:
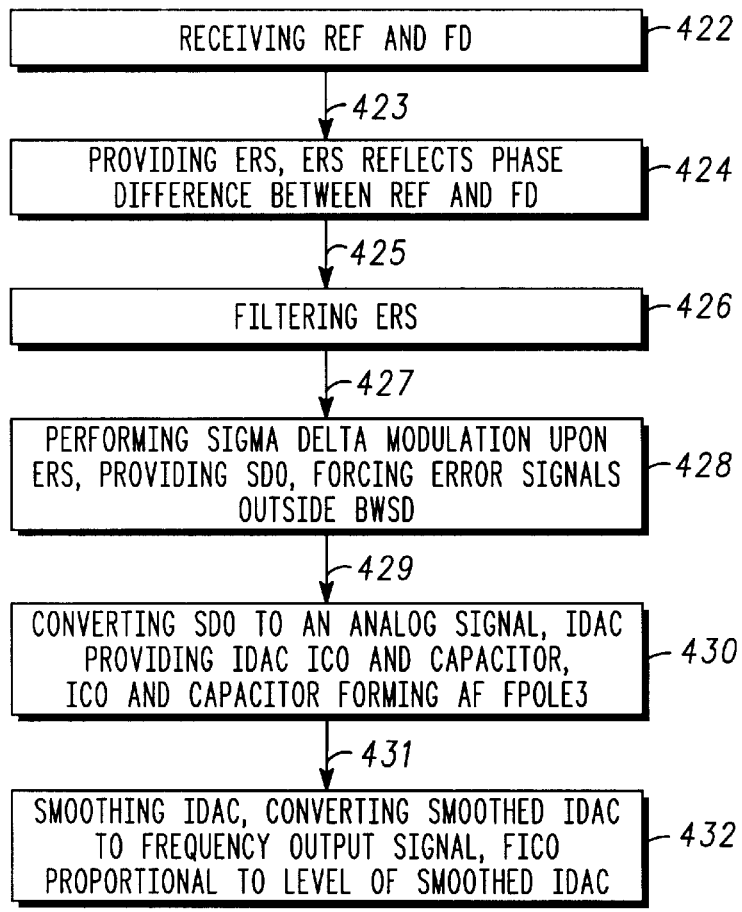
FIG. 4 is a flow chart of a method for providing a low jitter phase locked loop signal.

FIG. 4 is a flow chart of a method 420 for providing a low jitter phase locked loop signal, according to preferred embodiment of the invention. Rectangular boxes 422, 424, 426, 428, 430 and 432 represent steps of method 420. As indicated by paths 423, 425, 427, 429 and 431, steps 422–432 are executed in sequential order.

Method 420 comprises of the following steps:

Receiving, during step 422, an external reference signal REF and a divided output signal FD having a frequency of Ffd, wherein Ffd=Fico/N, Fico being the frequency of a frequency output signal ICOS of a current controlled oscillator, N being a programmable division factor.

Providing, during step 424, an error signal ERS reflecting the phase difference between REF and FD;

Filtering, during step 426, the error signal ERS. Preferably, ERS passes through a digital integrator.

Performing, during step 428, a sigma delta modulation upon ERS, providing a digital sigma delta control signal SDO and forcing error signals outside a predetermined frequency BWsd.

Converting, during step 430, the digital sigma delta control signal SDO to an analog signal Idac and providing Idac to a current controlled oscillator and a capacitor, the current controlled oscillator and the capacitor introduce a pole Fpole in the transfer function of the PLL. Fpole tracks BWsd.

Smoothing Idac, during step 432, and converting the smoothed Idac signal to the frequency output signal. Fico is dependent upon the level of the smoothed Idac.

Figure 5:
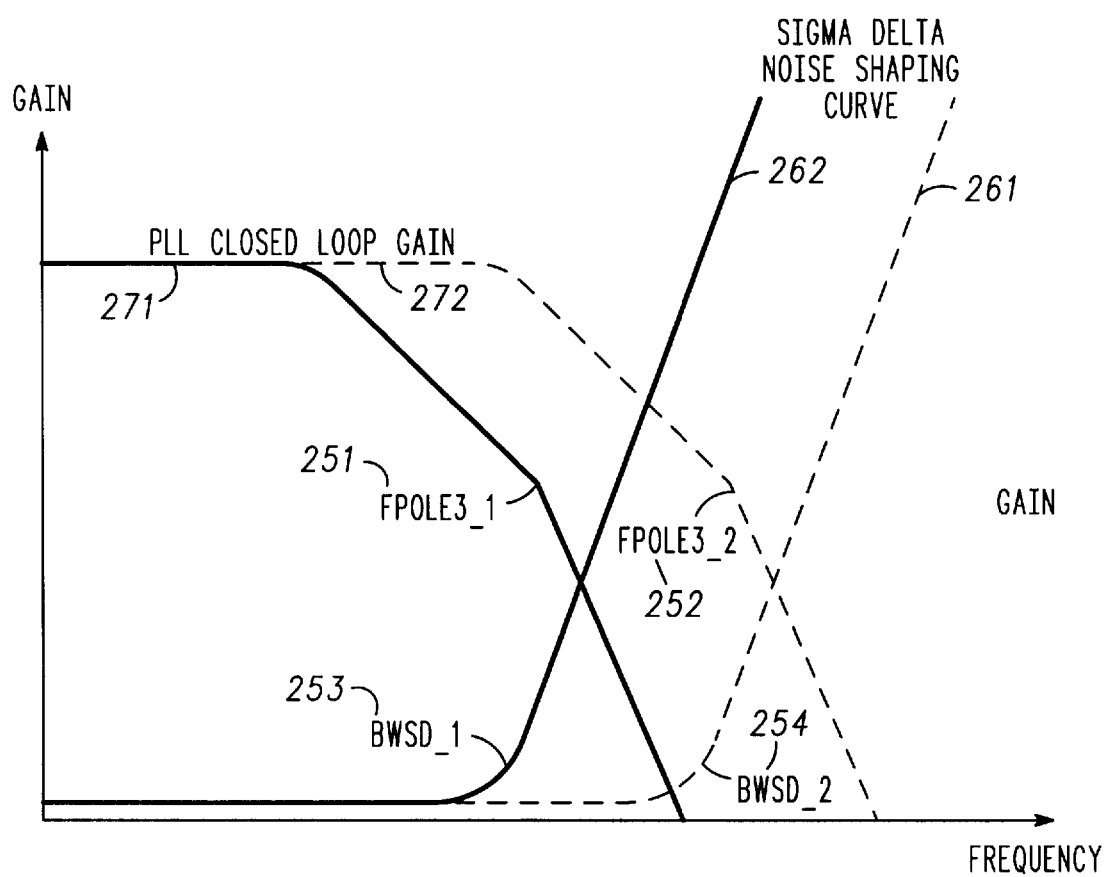
FIG. 5 is a schematic characteristic of the sigma delta modulator and of the phase locked loop according to a preferred embodiment of the invention.

FIG. 5 is a schematic characteristic of the sigma delta modulator and of the phase locked loop according to a preferred embodiment of the invention.

Curve 271 reflects the transfer function of PLL 8 and curve 262 reflects the noise rejection characteristics of delta sigma modulator 24, where N=N1, OSR1=Fico1/Fre1. Fpole_1 251 is proportional to Fref1, Fpole_1≈1/√(Rinv1*C1), and BWsd is related to OSR1. Dashed curve 272 reflects the transfer function of PLL 8 and dashed curve 262 reflects the noise rejection characteristics of delta sigma modulator 24, where N=N2, OSR2=Fico2/Fre2. Fpole_2 252 is proportional to Fref1, Fpole_2≈1/√(Rinv1*C1), and BWsd 254 is related to OSR2.

It should be noted that the particular terms and expressions employed and the particular structural and operational details disclosed in the detailed description and accompanying drawings are for illustrative purposes only and are not intended to in any way limit the scope of the invention as described in the appended claims.

Thus, there has been described herein an embodiment including at least one preferred embodiment of an improved method and apparatus for a low jitter phase locked loop having a sigma delta modulator and a method thereof. It will be apparent to those skilled in the art that the disclosed subject matter may be modified in numerous ways and may assume many embodiments other than the preferred form specifically set out and described above.

Accordingly, the above disclosed subject matter is to be considered illustrative and not restrictive, and to the maximum extent allowed by law, it is intended by the appended claims to cover all such modifications and other embodiments which fall within the true spirit and scope of the present invention. The scope of the invention is to be determined by the broadest permissible interpretation of the following claims and their equivalents rather than the foregoing detailed description.

We claim:

1. A phase lock loop comprising:
    a current controlled oscillator, adapted to provide an output signal ICOS having a frequency of Fico, wherein Fico is controlled by a current input signal Idac, the current controlled oscillator having an input resistance Rin; Rin is proportional to Idac;
    a frequency divider, coupled to the current controlled oscillator, for receiving ICOS and providing a frequency divider output signal FD, the frequency of FD is Ffd and Ffd=(Fico/N), N>0;
    a phase detector, coupled to the frequency divider and adapted to be coupled to a reference signal for receiving a reference signal REF, REF having a frequency of Fref; wherein the phase detector receives REF and FD and provides an error signal ERS that reflects the phase difference between REF and FD;
    a loop filter, coupled to the phase detector; for filtering ERS;
    a sigma delta modulator, coupled to the loop filter, for performing sigma delta modulations upon the output signal of the loop filter, and for providing a digital sigma delta modulated control signal SDO;
    a digital to analog converter, coupled to the sigma delta modulator and to the current controlled oscillator, for converting SDO to Idac and providing Idac to the current controlled oscillator; and
    a capacitor, coupled to the current controlled oscillator, the capacitor and Rin generate a pole Fpole in the transfer function of the phase locked loop.

2. The phase locked loop of claim 1 wherein the sigma delta modulator sampling rate is Fico, the sigma delta modulator forces error signal outside a predetermined frequency BWsd; and
    wherein Fpole tracks BWsd.

3. The phase lock loop of claim 2 wherein the sigma delta modulator is of second order.

4. The phase lock loop of claim 3 wherein the current controlled oscillator is comprised of a odd number of inverters; the inverters are cascaded and the output of a last inverter ic coupled to the input of a first inverter;
    wherein each inverter is comprised of an n-channel CMOS transistor and a p-channel CMOS transistor.

5. A method for providing a low jitter phase locked signal from a phase locked loop, the method comprising of the steps of:
    receiving an external reference signal REF and a divided output signal FD, wherein a current controlled oscillator provides a frequency output signal ICOS having a frequency of Fico, the frequency output signal ICOS is provided to a frequency divider, the frequency divider provides the divided output signal FD, FD having a frequency of Ffd, Ffd being a fraction (1/N) of Fico;

providing an error signal ERS reflecting the phase difference between REF and FD;

filtering the error signal ERS;

performing a sigma delta modulation upon ERS, providing a digital sigma delta control signal SDO and forcing error signals outside a predetermined frequency BWsd;

converting the digital sigma delta control signal SDO to an analog signal Idac and providing Idac to the current controlled oscillator and a capacitor, the current controlled oscillator and the capacitor introduce a pole Fpole in a transfer function of the phase locked loop, wherein Fpole tracks BWsd; and smoothing Idac and converting the smoothed Idac signal to the frequency output signal, wherein Fico is dependent upon the smoothed Idac.

6. The method of claim 5 wherein ERS if filtered by passing ERS through a digital integrator.

\* \* \* \* \*